United States Patent
Kwon et al.

[11] Patent Number: 5,898,191
[45] Date of Patent: *Apr. 27, 1999

[54] ARRAY OF OPTICAL INTEGRATED DEVICES WITH MICRO-LENSES

[75] Inventors: Young-Se Kwon, Taejon; O-Seung Yang, Seoul, both of Rep. of Korea

[73] Assignee: Korea Advanced Institute of Science and Technology, Taejon, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/582,162

[22] Filed: Jan. 2, 1996

[30] Foreign Application Priority Data

Jan. 25, 1995 [KR] Rep. of Korea .......................... 95-1321

[51] Int. Cl.$^6$ .................................................. H01L 33/00
[52] U.S. Cl. .............................. 257/95; 257/98; 257/432; 257/460
[58] Field of Search .................................. 257/98, 99, 95, 257/432, 434, 443, 460, 80, 84; 359/619–622; 372/44, 45, 46

[56] References Cited

U.S. PATENT DOCUMENTS 4,339,689  7/1982  Yamanaka et al. ........................ 257/98

OTHER PUBLICATIONS

Cho, G.S. and Kwon, Y.S., AlGaAs/GaAs Lens-shaped LED with High Efficiency and Narrow Filed Pattern, Optoelectronic Component Technologies, 1813:96–107 (1992).

Hahm, S.H. et al., GaAs/AlGaAs Lensed Light Emitting Diode by the Meltback and Regrowth in Liquid Phase Epitaxy, Jpn. J. of Appl. Phys., 30(5B):910–913 (1991).

Yoo, T.K. et al., Surface/Emitting AlGaAs/GaAs DH LED with Buried–Window Cylindrical Lens, Jpn. J. of Appl. Phys., 27(12):2357–2360 (1988).

*Primary Examiner*—Minh Loan Tran
*Attorney, Agent, or Firm*—Darby&Darby

[57] ABSTRACT

An optical integrated device having an even height such that it can be easily arrayed or integrated with other devices in a single substrate. The device includes a semi-conductor substrate having a substrate-side electrode which is formed on one side of the semi-conductor substrate. A micro-lens layer is epitaxially grown on the opposite side to where the substrate-side electrode is formed. The opposite side also has a hemispherically etched surface. The device also includes epitaxial layers which are grown on a whole area on the micro lens layer and a dielectric film which is formed on the epitaxial layers. Additionally, an epilayer-side electrode is formed on a whole area of the dielectric film.

1 Claim, 3 Drawing Sheets

ARRAY OF OPTICAL INTEGRATED DEVICES WITH MICRO-LENSES

FIELD OF THE INVENTION

The present invention relates to an array of optical integrated devices on which micro-lenses are formed and the fabricating method thereof, more specifically, to an optical integrated device which can be applied in light-transmitting or receiving parts of optical communication system in a short distance, optical displaying devices, highly-sensitive photodetectors and high-speed LED printers, and the fabricating method thereof.

BACKGROUND OF THE INVENTION

A conventional optical device with a micro-lens is fabricated to form the lens by employing selective meltback etching and regrowth techniques. FIG. 1 is a cross-sectional view showing the structure of the conventional optical device fabricated by employing the aforementioned techniques. The optical device is fabricated by a process which comprises the steps of: forming an etching mask on a single crystal substrate (4), performing meltback etching on the substrate, growing a thin layer to give a micro-lens (1) by regrowth technique, and evaporating an electrode (2) for ohmic contact.

However, the optical device fabricated by the prior art process has revealed some drawbacks in a sense that a tall and uneven ridge (3) ranging 10 micro meter to 30 micro meter in height is essentially created in the course of regrowing the thin layer, which makes it difficult not only to array a plurality of the optical devices in a single substrate as well as to integrate the optical devices with the other devices in a subsequent step.

SUMMARY OF THE INVENTION

A primary object of the invention is, therefore, to provide an optical integrated device with a micro-lens, whose ridge is not subject to the problem of uneven height so that it can be easily arrayed or integrated with the other devices in a single substrate.

The other object of the invention is to provide a method for fabricating the said optical integrated device or its array in a simple and efficient manner.

BRIEF DESCRIPTION OF THE DRAWINGS

The above and the other objects and features of the present invention will become apparent from the following descriptions given in conjunction with the accompanying drawings, in which.

DETAILED DESCRIPTION OF THE INVENTION

The present inventors fabricates an optical integrated device with a micro-lens by employing a method which comprises the steps of: (i) forming a meltback mask on a semiconductor substrate, and then forming a hemispherical etching surface on the substrate by a selective meltback etching technique; (ii) growing an epitaxial layer on the whole surface of the meltback-etched semiconductor substrate by an epitaxy process after the meltback mask is removed, forming a dielectric film on the epitaxial layer to produce a current blocking layer, and then forming an electrode of epilayer side on the dielectric film by evaporating metallic material; (iii) etching the backside of the semiconductor substrate, and then forming an electrode of substrate side on the etched surface of the substrate by evaporating metallic material; (iv) removing part of metallic material from the electrode of substrate side to produce the etching window for micro-lens exposure, and then etching the semiconductor substrate through the etching window by a preferential etching technique until the micro-lens is completely exposed; and, (v) forming an ohmic contact by rapidly heating the optical integrated device thus fabricated.

As a result, an optical integrated device with a micro-lens fabricated by the invention comprises: a semiconductor substrate; a substrate-side electrode which is formed on one side of the semiconductor substrate; a micro-lens layer which is epitaxially grown on a whole area of an opposite side to where the substrate-side electrode is formed, the opposite side having a hemispherically etched surface; epitaxial layers which are epitaxially grown on a whole area of the micro-lens layer; a dielectric film which is formed on the epitaxial layers; and an epilayer-side electrode which is formed on a whole area of the dielectric film.

The present invention also provides a multi-connection array method of light transmitting and receiving parts in optical communication system employing the optical integrated device with a micro-lens, 1-dimensional/2-dimensional array method of the optical integrated devices, and an array method of forming an optical integrated device and its electronic driving device on a single substrate.

Figure 2:
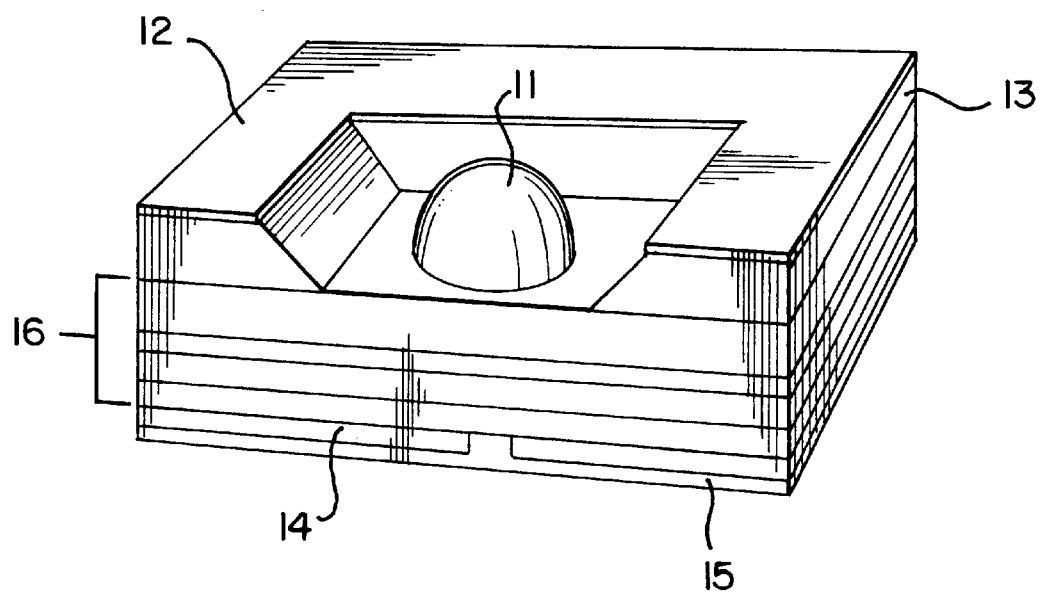
FIG. 2 is a perspective view illustrating an optical integrated device fabricated by a preferred embodiment of the present invention.

FIG. 2 is a perspective view illustrating an optical integrated device according to a preferred embodiment of the present invention. Referring to FIG. 2, a hemispherical etching surface is first formed on a semiconductor substrate (13) of GaAs group by employing a selective meltback etching technique, and thereafter the meltback mask made of $SiO_2$ or $Si_3N_4$ is removed. Then, an AlGaAs micro-lens layer (11) is epitaxially grown on the whole surface of the hemispherically etched side of the semiconductor substrate (13), so that the hemispherical etching surface can serve as an optical lens. Thereafter, epitaxial layers (16) (hereinafter, referred to as "epilayers") are grown on the whole area of the micro-lens layer (11) by means of an epitaxy process. The epilayers (16) are used for a light emitting or receiving device, depending on a designer's purpose, and for a drive circuit. A dielectric film (14) made of $SiO_2$ or $Si_3N_4$ is placed on the epilayer (16) to limit current within narrow injection area, a contact pattern is then formed on the dielectric film (14), and an electrode (15) of epilayer side is formed on the dielectric film (14) by evaporating P-type metal made of Au/AuZn/Au or CrAu with a thermal evaporation technique. To improve an ohmic property of the optical integrated device, the semiconductor substrate (13) is thinned, leaving about 100 micro meter in thickness. At this time, a mixture of $NH_4OH:H_2O_2:H_2O=1:1:2(v/v/v)$ may be preferably used as an etching solution, and etching rate is preferably controlled at 2.5 micro meter per minute. N-type metal made of AuGe/Ni/Au is then evaporated on the etched surface by a thermal evaporation technique, to form an electrode (12) of substrate side.

Figure 1:
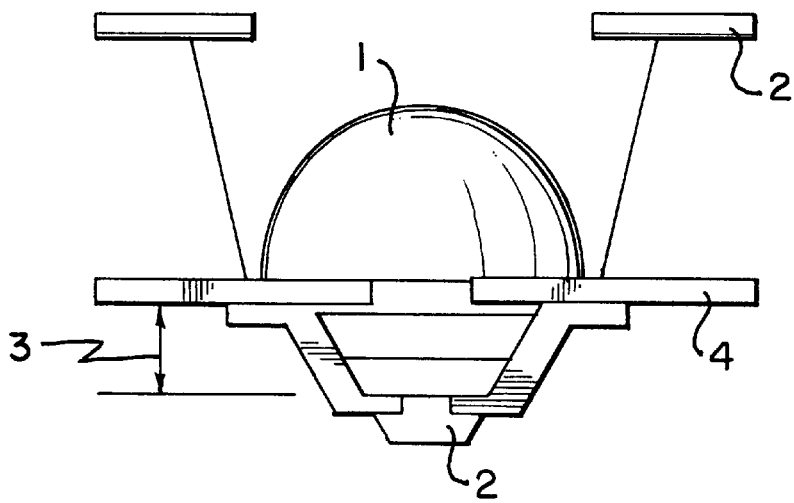
FIG. 1 is a schematic cross-sectional view illustrating the structure of a conventional optical device with a micro-lens.

N-type metal of the electrode (12) of substrate side formed on the semiconductor substrate (13) is removed, from the area where a micro-lens (11) is to be exposed, by employing a front-to-back side aligning technique, and preferential etching of GaAs is then performed until the micro-lens (11) appears. At this time, a mixed solution of $NH_4OH:H_2O_2=1:30(v/v)$ may be preferably employed as an etching solution, and etching rate is preferably controlled at 20 micro meter per minute under a temperature of 40° C. To secure the ohmic contact of the electrode layer, an ohmic alloy process is applied to the single device or device array(1-dimensional or 2-dimensional array as shown in FIG. 1) achieved by the aforementioned process, by employing a rapid thermal annealing(RTA) technique under the ambient temperature of 450° C. for one minute.

Figure 3:
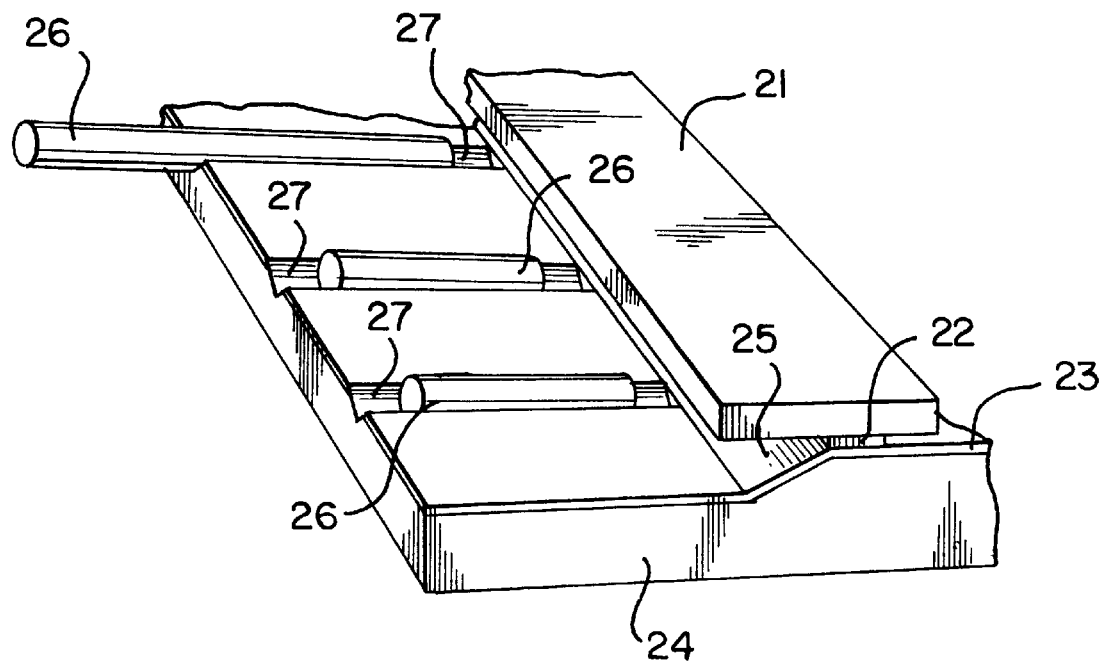
FIG. 3 is a perspective view illustrating multi-connection array method between light transmitting and receiving parts in optical communication system employing an optical integrated device of the invention.
Figure 4:
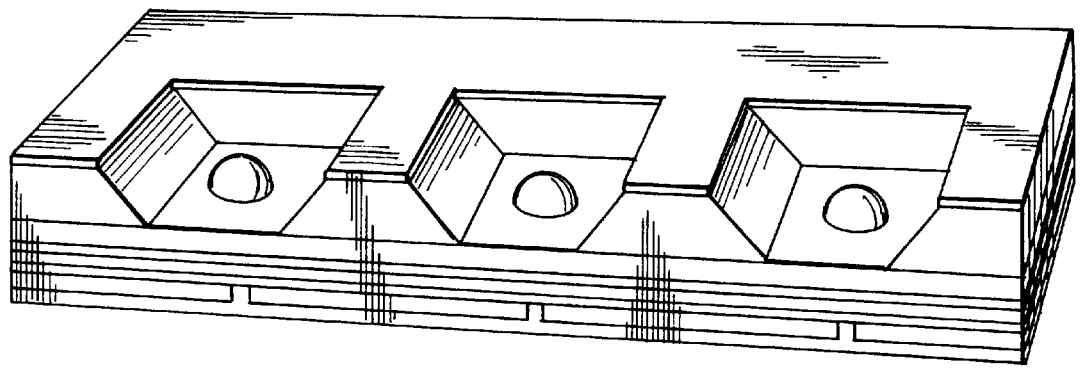
FIG. 4 is a perspective view illustrating an 1-dimensional array method of an optical integrated device of the invention.

FIG. 3 is a perspective view illustrating multi-connection array method of light transmitting and receiving parts in optical communication system employing the optical integrated device array depicted in FIG. 4. As shown in FIG. 3, the multi-connection array is preferably achieved by the processes of etching a silicon submount (24) to have slanting surface (25) of 45° angle, and then bonding a flip-chip (21) with the silicon submount (24) having a reflective metal (23) on the slanting surface (25) by employing soldering bumper (22). When the array device is activated in the optical communication system, the beam emitted from the light emitting device is headed downward, then reflected on the slanting surface (25), and then transmitted the silicon submount (24) in parallel. At this time, if an optical fiber (26) is disposed to the position at which the beam is passed by, a multi-connection of the beam may be successfully achieved through the optical fiber (26). In FIG. 3, the multi-connection of light transmitting and receiving parts in the optical communication system may be completed by forming V-groove (27) for guiding the optical fiber (26) by etching the silicon submount (24).

On the other hand, in a case that the optical integrated device depicted in FIG. 2 is employed as a light receiving device in the light receiving part, the device array is formed in the same manner as in FIG. 3, while the direction of the beam is opposite to that of the light emitting device. That is, the beam transmitted to the optical fiber is emitted through its right end shown in FIG. 3, then reflected to the slanting surface (25), and then absorbed into the light receiving device array having a micro-lens disposed thereover.

Figure 5:
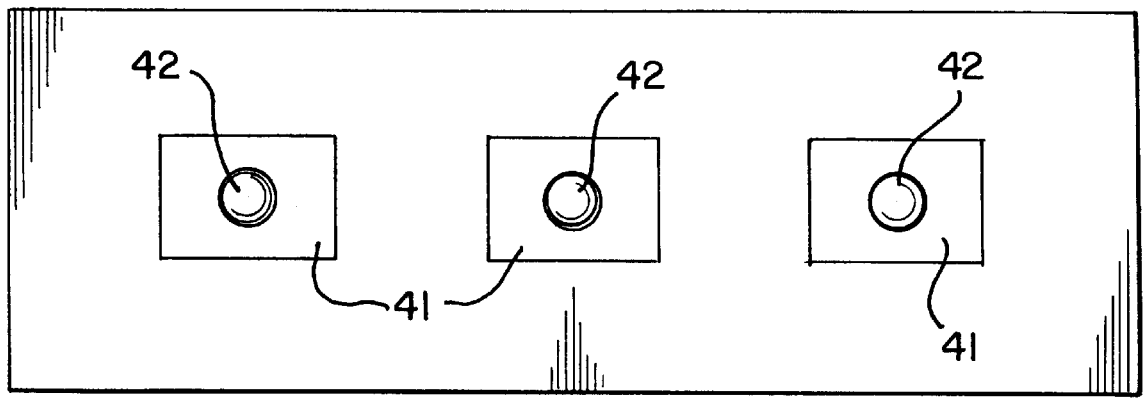
FIG. 5 is a schematic diagram showing the optical integrated device shown in FIG. 4; and, FIG. 6 is a schematic diagram showing a single substrate in which both an optical integrated device and its electronic driving device are integrated together.

FIG. 4 is a perspective view illustrating 1-dimensional array of the optical integrated device of the invention, and FIG. 5 is a schematic diagram showing the optical integrated device shown in FIG. 4. As shown in FIG. 5, each optical integrated device can be independently driven by applying a respective drive signal to each electrode (41) of epilayer side formed on the contact pattern (42). Moreover, in a case that an optical integrated device is connected with each other by employing contact metal, the connected optical integrated devices can be driven in a simultaneous manner.

Figure 6:
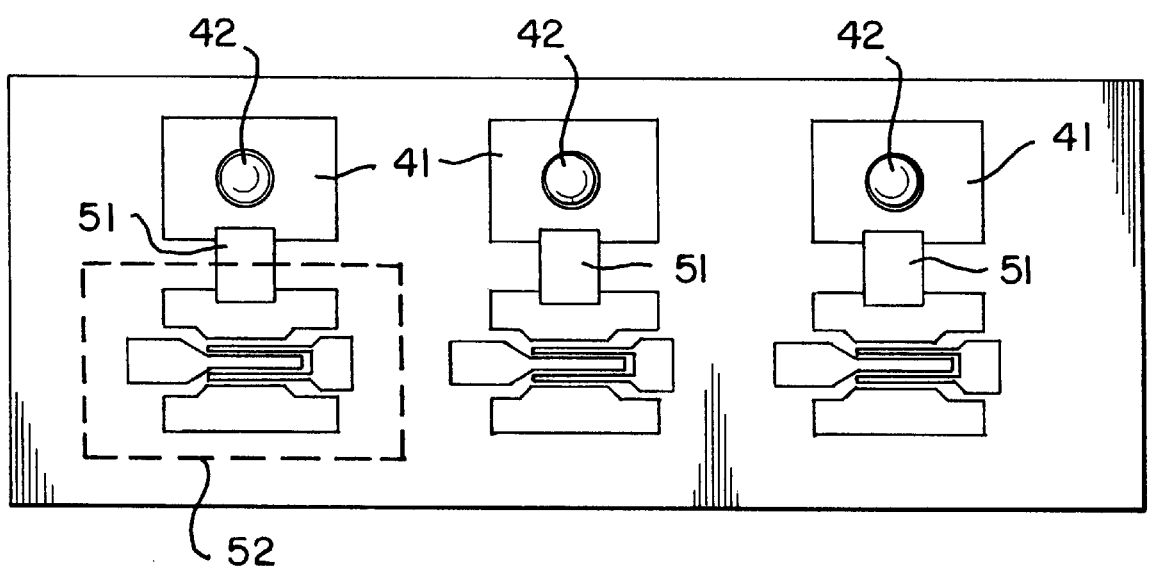

FIG. 6 is a schematic diagram showing a single substrate in which both an optical integrated device and an electronic driving device are integrated together. As shown in FIG. 6, the electrode (41) of the optical integrated device is connected with an electrode (52) of electronic driving device by employing a metallic film (51).

As clearly illustrated as above, the present invention provides an array of optical integrated devices with micro-lenses whose ridge is not subject to the problem of uneven height so that it can be easily arrayed or integrated with the other devices in a single substrate. The optical integrated device of the invention can be widely applied in light-transmitting or receiving parts of optical communication system in a short distance, optical displaying devices, highly-sensitive photodetectors and high-speed LED printers, and so on.

What is claimed is:

1. An optical integrated device for arraying with at least one other optical integrated apparatus having a first height, said device comprising:

(i) a semiconductor substrate including first and second sides;

(ii) a substrate-side electrode which is formed on the first side of the semiconductor substrate;

(iii) a micro-lens layer which is epitaxially grown on a whole area of the second side of the substrate, the second side having a substantially smooth, hemispherically etched surface formed by a melt-back etching technique, said substantially smooth surface allowing a proper focusing of light;

(iv) epitaxial layers which are epitaxially grown on a whole area of the micro-lens layer, said epitaxial layers defining a predetermined ridge height substantially even with said first height;

(v) a dielectric film which is formed on the epitaxial layers; and (vi) an epilayer-side electrode which is formed on a whole area of the dielectric film, whereby said predetermined ridge height is substantially even with said first height of said other apparatus enables arraying of said device and said apparatus.

* * * * *